(12) United States Patent
Scheltjens et al.

(10) Patent No.: US 12,337,345 B2
(45) Date of Patent: Jun. 24, 2025

(54) PLASMA COATING METHOD FOR COATING PARTICULATE MATTER

(71) Applicant: PARTIX, Leuven (BE)

(72) Inventors: Gill Scheltjens, Boom (BE); Régis Heyberger, Thionville (FR); Marc Jacobs, Koerich (LU); Russel Pescod, Laarne (BE); Filip Van Der Gucht, Boechout (BE)

(73) Assignee: PARTIX, Leuven (BE)

( * ) Notice: Subject to any disclaimer, the term of this patent is extended or adjusted under 35 U.S.C. 154(b) by 0 days.

(21) Appl. No.: 18/034,498

(22) PCT Filed: Oct. 29, 2021

(86) PCT No.: PCT/EP2021/080217
§ 371 (c)(1),
(2) Date: Apr. 28, 2023

(87) PCT Pub. No.: WO2022/090518
PCT Pub. Date: May 5, 2022

(65) Prior Publication Data
US 2023/0398570 A1    Dec. 14, 2023

(30) Foreign Application Priority Data
Oct. 29, 2020    (EP) .................................... 20204638

(51) Int. Cl.
*B05D 3/14*    (2006.01)
*B05D 1/00*    (2006.01)

(52) U.S. Cl.
CPC ...................................... *B05D 1/62* (2013.01)

(58) Field of Classification Search
CPC ...................................................... B05D 1/62
See application file for complete search history.

(56) References Cited

U.S. PATENT DOCUMENTS

| | | | |
|---|---|---|---|
| 3,247,014 A | 4/1966 | Goldberger et al. | |
| 5,198,029 A | 3/1993 | Dutta et al. | |
| 5,489,449 A | 2/1996 | Umeya et al. | |
| 8,624,139 B2* | 1/2014 | Huang | H01H 15/24 200/547 |
| 8,642,139 B2 | 2/2014 | Knapp et al. | |
| 9,259,905 B2 | 2/2016 | Wilken et al. | |
| 2005/0158480 A1* | 7/2005 | Goodwin | C23C 4/123 427/569 |
| 2008/0118734 A1* | 5/2008 | Goodwin | B05D 1/62 428/221 |
| 2010/0279027 A1* | 11/2010 | Pingree | C23C 16/50 427/579 |
| 2014/0170410 A1* | 6/2014 | Rupprecht | C23C 4/12 428/327 |
| 2016/0039979 A1* | 2/2016 | Gilliam | C08J 3/24 525/303 |
| 2016/0295676 A1* | 10/2016 | Patelli | H05H 1/2406 |
| 2017/0101317 A1* | 4/2017 | Malaibari | C01B 32/16 |
| 2017/0297055 A1* | 10/2017 | Detrembleur | C09D 133/26 |
| 2020/0208266 A1 | 7/2020 | King et al. | |
| 2021/0254218 A1* | 8/2021 | Scheltjens | B05D 1/26 |
| 2023/0024945 A1* | 1/2023 | Scheltjens | C23C 16/45563 |
| 2023/0066187 A1* | 3/2023 | Scheltjens | B05D 3/142 |

FOREIGN PATENT DOCUMENTS

| | | | | |
|---|---|---|---|---|
| EP | 0093779 B1 * | 11/1982 | | B05D 1/36 |
| EP | 3586954 A1 | 1/2020 | | |
| FR | 2834298 A1 | 7/2003 | | |
| WO | 2005039753 A1 | 5/2005 | | |
| WO | WO 2019/135555 A1 * | 7/2019 | | C23C 16/40 |

OTHER PUBLICATIONS

Kim, B.S., et al., "Effect of plasma treatment on the mechanical properties of natural fiber/PP composites". High Performance Structures and Materials IV, WIT Transactions on the Built Environment, vol. 97, 2008, pp. 159-166.*

Gupta, G., et al., "Plasma sprayed coatings of glass microspheres premixed with Al2O3 particles". Surface Engineering, vol. 29, No. 10, 2013, pp. 755-760.*

Vardelle, M., et al., "Coating generation: Vaporization of particles in plasma spraying and splat formation". Pure & Appl. Chem., vol. 68, No. 6, 1996, pp. 1093-1099.*

Antonini, James H., et al., "Review of the physicochemical properties and associated health effects of aerosols generated during thermal spray coating processes". Toxicol Ind Health, Jan. 2021 37(1) 47-58.*

(Continued)

*Primary Examiner* — Bret P Chen
(74) *Attorney, Agent, or Firm* — Workman Nydegger

(57) ABSTRACT

A plasma coating method for coating particulate matter, including the steps of: a) providing a low-temperature atmospheric plasma jet from a plasma gas outside of the reaction chamber; b) inserting a precursor into the plasma jet, thereby obtaining a plasma coating flow comprising an excited precursor, followed by injecting the plasma coating flow comprising the excited precursor in the reaction chamber, and c) subjecting particulate matter to said plasma coating flow comprising said excited precursor, thereby obtaining particulate matter comprising an at least partial coating. a coating reactor apparatus and a system involve the plasma coating method.

15 Claims, 3 Drawing Sheets

(56) References Cited

OTHER PUBLICATIONS

Hanabusa et al., "Surface Modification of Particles in a Plasma Jet Fluidized Bed Reactor", Surface and Coatings Technology, vol. 88, No. 1-3, Mar. 11, 1996, pp. 226-231.
Geismann et al., "Photoreactive Functionalization of Poly(ethylene terephthalate) Track-Etched Pore Surfaces with "Smart" Polymer Systems", Macromolecular Chemistry and Physics, vol. 206, Issue 2, Jan. 17, 2005, pp. 268-281.
Papra et al., "Synthesis of Peptides onto the Surface of Poly(Ethylene terephthalate) Particle Track Membranes", Journal of Applied Polymer Science, vol. 74, Sep. 20, 1999, pp. 1669-1674.
Sathiyamoorthy, "Plasma Spouted/Fluidized Bed for Materials Processing", Journal of Physics: Conference Series, vol. 208, No. 1, 23rd National Symposium on Plasma Science & Technology (PLASMA-2008), Dec. 10-13, 2008, 15 pages.
Extended European Search Report from corresponding European Patent Application No. EP20204638.9, Oct. 11, 2021.
International Search Report from corresponding PCT Application No. PCT/EP2021/080217, Apr. 13, 2022.
International Preliminary Report on Patentability from corresponding PCT Application No. PCT/EP2021/080217, Nov. 24, 2022.

\* cited by examiner

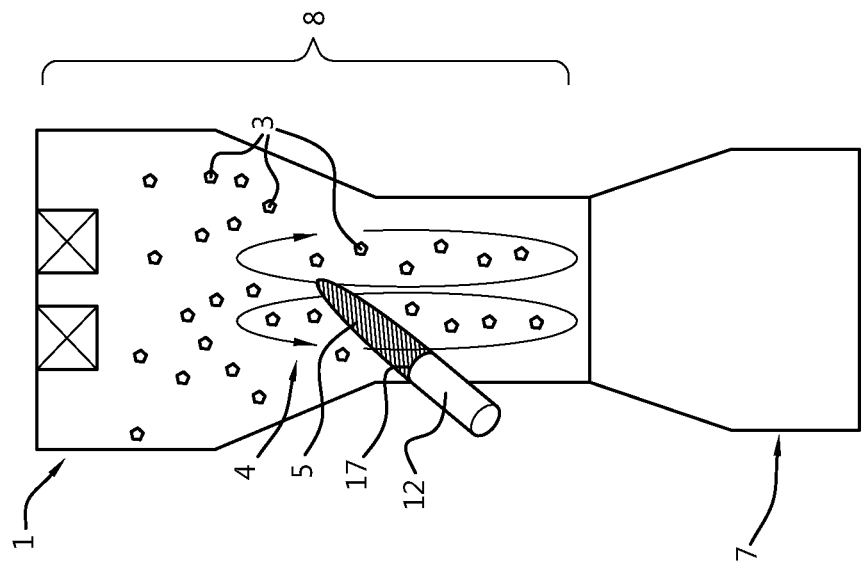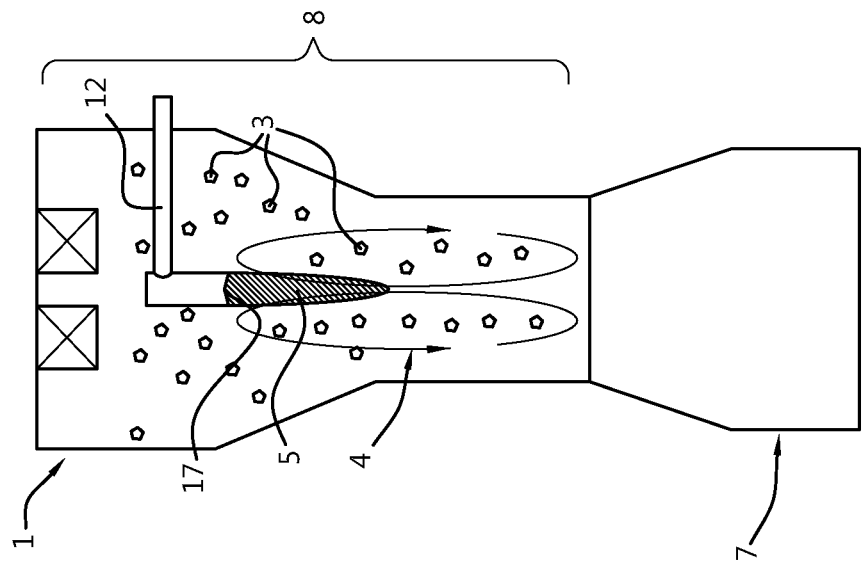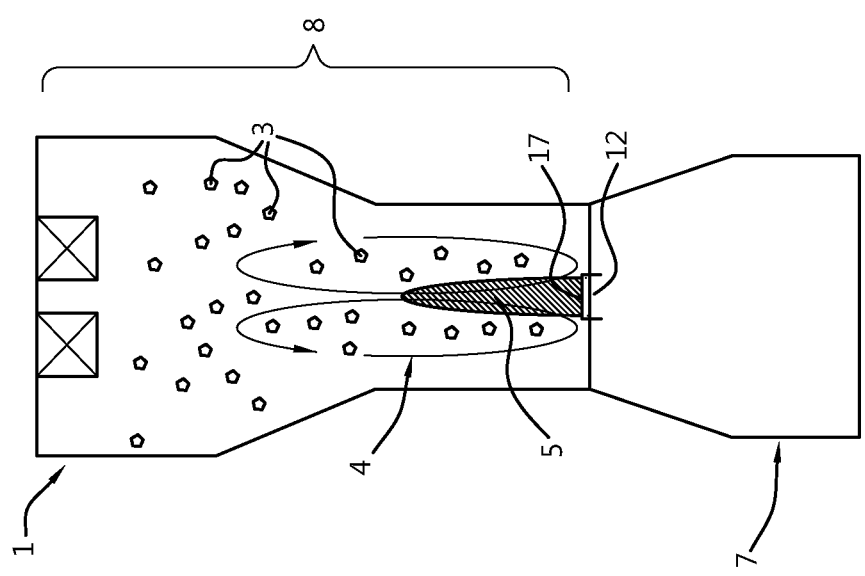

PLASMA COATING METHOD FOR COATING PARTICULATE MATTER

TECHNICAL FIELD

The present invention relates to the field of plasma coating of particulate matter such as powder and granulates by means of a low temperature, atmospheric pressure plasma into which a precursor is inserted, which forms a coating layer on the individual particles of the particulate matter.

BACKGROUND OF THE INVENTION

Particulate matter is used in many applications. In some applications, particulate matter is used for chemical reactions and is particularly useful due to the large contact surface. In other applications, the particulate matter is used for mechanical applications, e.g. grinding, or the particulate matter needs to have an increased or decreased adhesion to other materials. In these and other applications, it could be beneficial to provide the individual particles of the particulate with an at least partial coating to increase the particles' functionality.

A number of techniques exist to treat powder and other particulate matter and provide it with functionalizing properties.

U.S. Pat. No. 5,489,449 discloses a particle of an inorganic or metallic material which is coated on the surface with ultrafines of an inorganic or metallic material. The coated particle is produced by introducing the particles of the inorganic or metallic material to be coated into a stream carrying the ultrafines of the inorganic or metallic material formed in a vapor phase and bringing the particles to be coated into contact with said ultrafines in a fluidized state. The coated particles are used for the production of a sintered product. It would seem that a high-temperature vacuum plasma is used to coat the particles.

WO2005039753A1 discloses a method of functionalising a powdered substrate. The method comprises the following steps: passing a gas into a means for forming excited and/or unstable gas species, typically an atmospheric pressure plasma or the like and treating the gas such that, upon leaving said means, the gas comprises excited and/or unstable gas species which are substantially free of electric charge. The gas comprising the excited and/or unstable gas species which are substantially free of electric charge is then used to treat a powdered substrate and a functionalising precursor in a downstream region external to the means for forming excited and/or unstable gas, wherein neither the powdered substrate nor the functionalising precursor have been subjected to steps (i) and (ii) and wherein said functionalising precursor is introduced simultaneously with or subsequent to introduction of the powdered substrate. Preferably the method takes place in a fluidised bed. It would seem that this method involves striking a plasma in a gas, allowing this plasma to recombine into excited and/or unstable, but electrically neutral gas species, and then subject the powder to this unstable/excited gas species. Such treatment activates the powder and allows binding of a functionalizing precursor on the powder. Although this method seems to work, it would seem that improvements can be made with respect to ensuring that any coating applied to the powder is durable and remains functional during an extended lifetime, as well as ensuring that all waste of precursor material is reduced as much as possible.

SUMMARY OF THE INVENTION

The present invention relates to a plasma coating method for coating particulate matter, comprising the steps of:

a) providing a low-temperature atmospheric plasma jet from a plasma gas;
b) inserting a precursor into the plasma jet, thereby obtaining a plasma coating flow comprising an excited precursor, and
c) subjecting particulate matter to said plasma coating flow comprising said excited precursor, thereby obtaining particulate matter comprising an at least partial coating.

Herein, the coating of the particulate matter is performed in a reaction chamber. Furthermore, the plasma jet in step a may be provided outside of the reaction chamber. Step b also may include injecting the plasma coating flow comprising the excited precursor in the reaction chamber. Injection of the plasma coating flow comprising the excited precursor may be done via a nozzle body of a nozzle, said nozzle body extending through the confines of the reaction chamber for guiding the precursor-comprising plasma coating flow from outside of the reaction chamber to within the reaction in order to coat particulate matter within the reaction chamber.

The method allows providing a layer onto matter which comes in the form of particles. The use of a plasma gas which is plasmized and provided in the form of a plasma jet, allows good control of the flows in the process. The insertion of the actual precursor used to form the coating into the plasma allows to excite the precursor indirectly by interacting with the plasma jet, rather than being excited directly, e.g. by electrical discharge. This reduces any breaking up of the precursor into smaller compounds during a plasmizing process. Once inserted into the plasma jet, the precursor gets excited, e.g. ionized, by collisions with the species in the plasma, typically making the precursor more reactive. The particulate matter then is subjected to excited precursors which can better attach to the surface of the particles. Hereby, if the species in the plasma are not all de-excited, these plasma species may also activate the surface of the particles, leading to increased adhesion. Depending on a number of conditions, in particular exposure time of the particles to plasma coating flow, the coating thus formed can cover the particles' surface partially or completely.

The present invention also relates to a coating reactor apparatus for coating particulate matter, comprising
  a reactor chamber for subjecting particulate matter in the reaction chamber to a plasma coating flow
  a plasma jet apparatus comprising:
    a plasma jet outlet for producing a plasma jet, and
    a nozzle comprising:
      a set of nozzle inlets for injection of a plasma and/or a precursor, said nozzle inlets located outside of the reaction chamber;
      at least one nozzle outlet for ejection of a precursor-comprising plasma, whereby the nozzle outlet is located within the reaction chamber;
      a nozzle body extending from the nozzle inlets to the nozzle outlet for guiding a precursor-comprising plasma coating flow from outside of the reaction chamber to within the reaction chamber,
    whereby at least one nozzle inlet is in fluid connection with the plasma jet outlet, and
    a precursor supply in fluid connection with at least one nozzle inlet.

The coating reactor apparatus of the present invention is particularly preferred to execute the method in accordance with the present invention. The apparatus hereto comprises a plasma jet apparatus, a nozzle and a reactor chamber. Hereby, the nozzle extends from a plasma jet outlet of the plasma jet apparatus, which is located outside of the reaction chamber, to within the reaction chamber allowing a plasma to be inserted within the particulate in the reaction chamber. The precursor can hereby be added to the plasma jet at the nozzle inlet for the plasma jet, near the nozzle outlet, or anywhere in between. The nozzle comprises a nozzle body allowing mixing of the precursor in the plasma jet and/or the plasma afterglow prior to insertion of the precursor-comprising plasma coating flow into the reaction chamber with the particulate matter.

The present invention further relates to a system comprising multiple coating reactor apparatuses according to the present invention, whereby the reactor chambers of the multiple reactor apparatuses are connected in series such that particulate matter can be coated subsequently in each of said multiple reactor apparatuses, and to a system comprising multiple coating reactor apparatuses according to the present invention, which are organized in parallel, whereby the coating reactor apparatuses are configured to simultaneously coat particulate matter.

OVERVIEW OF THE FIGURES

FIGS. 1A, 1B, 1C and 2 illustrate an apparatus according to the present invention. FIGS. 1A, 1B and 1C show an overview of three embodiments of the apparatus according to the present invention and FIG. 2 shows a detail of the apparatus of FIG. 1A at the region where plasma jet apparatus (7), nozzle (12) and reactor chamber (2) are connected.

Figure 2:
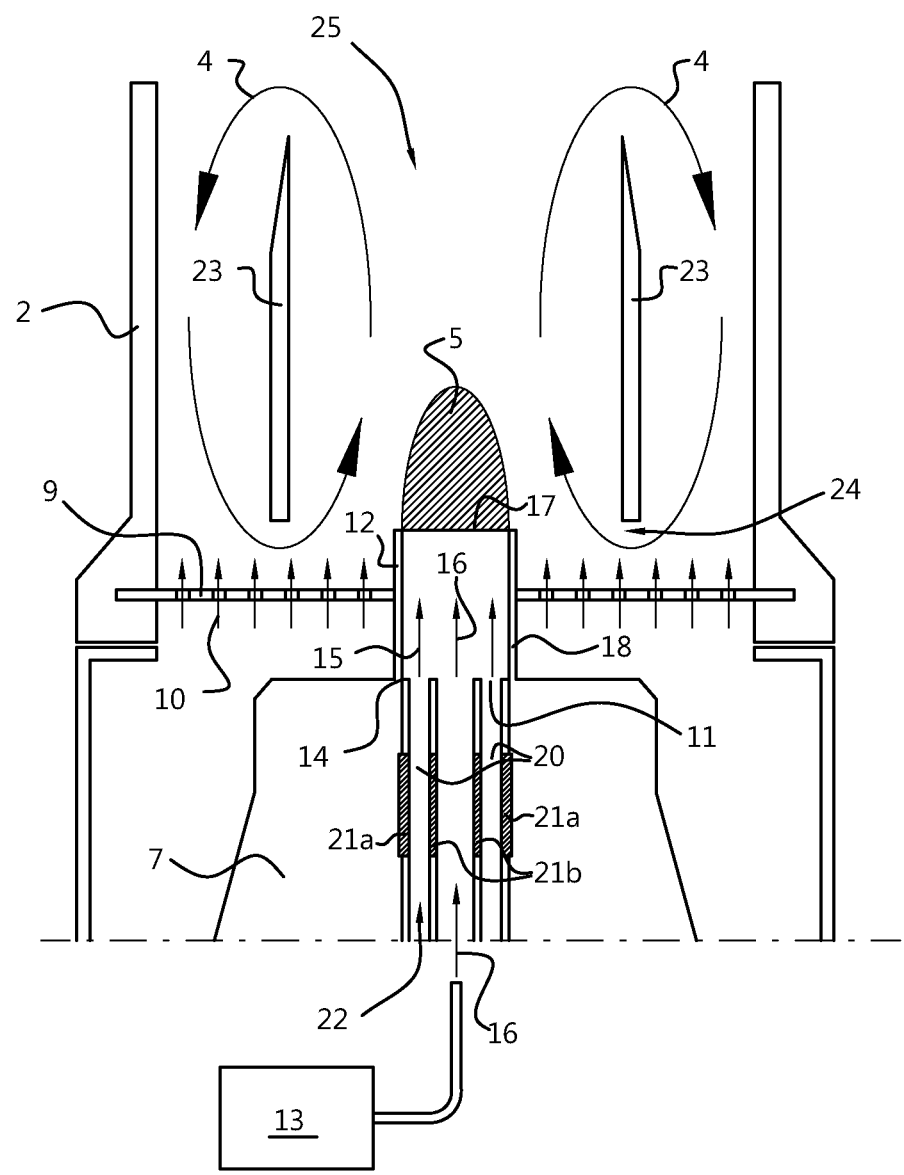

The figures serve to illustrate the invention.

DETAILED DESCRIPTION OF THE INVENTION

The present invention is further described below, with reference to the figures. Within the context of the present document, the following terms have the following meanings:

The term "coating" refers to a layer on top of a substrate's surface which has different properties of the substrate, e.g. a different structure, different chemical components, different density, etc.

The term "plasma" refers to a state of matter whereby at least a portion of the matter has been ionized such that it contains ions or ionized molecules and free electrons.

The term "plasma coating" refers to a coating which has been applied onto a substrate with the aid of a plasma.

The term "plasma jet" refers to a stream of plasma which is ejected from a plasma apparatus.

The term "plasma afterglow" refers to a region in a stream coming from a plasma jet which comprises excited species such as ions, free electrons and excited compounds, and which extends from the outlet of the plasma apparatus to a position in the stream where substantially all particles in the stream are stable.

The term "particulate matter" refers to matter which comes in the shape of particles, which may be macroscopic particles or microscopic particles.

The term "granular matter" refers to particulate matter whereby the particles are macroscopic in size, typically having a size of at least 100 microns.

The term "partial coating" refers to a coating which covers a portion of the substrate's surface, but not the complete surface. The portion may be a connected portion or a set of disconnected portions. In the present context of coating of particulate matter, the "partial coating" refers to the coating of an individual particle which is partial.

The term "fluidized" refers to the fluid-like state into which particulate matter can be brought, typically by dispersing the particulate matter into a flowing fluid.

The term "precursor" refers to a molecular or atomic compound which participates in the reaction, whereby its structure is altered e.g. due to chemical bonding, dissociation, change in electronical configuration. In the present document, the term precursor refers to a compound which is to form a coating layer onto a substrate.

The term "reaction chamber" refers to the confined part of the system of the present invention wherein the particulate matter can be coated. It basically takes care of confinement of the particulate matter during e.g. the coating of the particulate matter.

The present invention relates to a plasma coating method for coating particulate matter as described above and in the claims, and as further described below.

The precursor-comprising plasma can penetrate deeply into batches of particulate matter. However, it is seen that a particular good and homogeneous coating can be obtained when the particulate is treated when it is in a fluidized state. Hence, in an embodiment, the particulate matter (3) is subjected to the plasma in a fluidized state as illustrated in FIG. 1A-C wherein a particle flow (4) can be created due to the fluidized state. Without wishing to be bound by theory, it is believed that the fluidized state allows good mixing of the particles and the precursor-comprising plasma and better coating results. Preferably, the method is executed using a fluidized bed reactor. Fluidized particulate matter allows better coating of individual particles in the particulate. Furthermore, it also allows more homogeneous coating of the individual particles. A fluidized bed reactor is particularly preferred since it can be adapted to allow inject a plasma coating flow alternative to, or additional to, a gas flow for bringing the particulate in a fluidized state.

In an embodiment, the particulate is brought in a fluidized state by a fluidization flow. Alternatively, or additionally, the particulate is brought in a fluidized state by the plasma coating flow.

In an embodiment, the particulate matter is subjected indirectly to the plasma. Indirect subjection of the particulate matter to the plasma implies that the particulate matter does not enter the plasmizing region, i.e. the region where plasma is excited (20), e.g. the region between electrodes (21a, 21b) if an electrical discharge is used to ignite the plasma. Indirect subjection ensures that the plasma jet apparatus (7) is not contaminated by the particulate matter.

In an embodiment, the at least partial coating is a complete coating. A complete coating substantially covers the full surface of an individual particle. In many applications, a complete coating for the particles in the particulate is preferred. The completeness of a coating of a particle in a particulate may depend on a number of parameters such as flow rates of plasma gas and precursors and intensity of the plasma, as well as treatment time. The optimal parameters also depend largely on the nature and size of the particulate. The skilled person may ensure complete coating by trial-and-error, e.g. by increasing exposure time or by increasing precursor gas flow if tests show an incomplete coating.

The present invention can be used to treat particles of varying sizes. In an embodiment, the particulate matter comprises a size of at least 100 microns. Alternatively or additionally, the particulate matter comprises a size of at most 100 microns. Preferably, the particulate matter essentially consists of particles having sizes which allow the particulate to be fluidized.

In an embodiment, the particulate matter is coated by performing steps a to c in series, whereby particulate matter is subjected multiple times to plasma coating flow comprising the excited precursor. Hereby, the particulate matter (29) is preferably coated subsequently in different plasma coating flows (30a, 30b, 30c). This allows higher throughput of the particulate matter, and also better control of the coating process as the plasma coating flows can be individually configured. Such series processes are illustrated in FIGS. 3 and 4.

In an embodiment, the particulate matter is coated by performing steps a to c in parallel, whereby the particulate matter is distributed in portions which are subjected to separate plasma coating flows. Such parallel set-up allows higher throughput.

In an embodiment, the particulate matter is coated in a batch process, whereby an amount of particulate matter is inserted into the reactor chamber and exposed to the plasma coating flow for a batch treatment period, after which the coated particulate matter can be evacuated from the reactor chamber. Alternatively, the particulate matter is coated in a continuous process, whereby particulate matter is fed (31) into the reactor chamber at a first location and coated particulate matter is extracted from the reactor chamber at a second location which is different than the first location.

Figure 3:
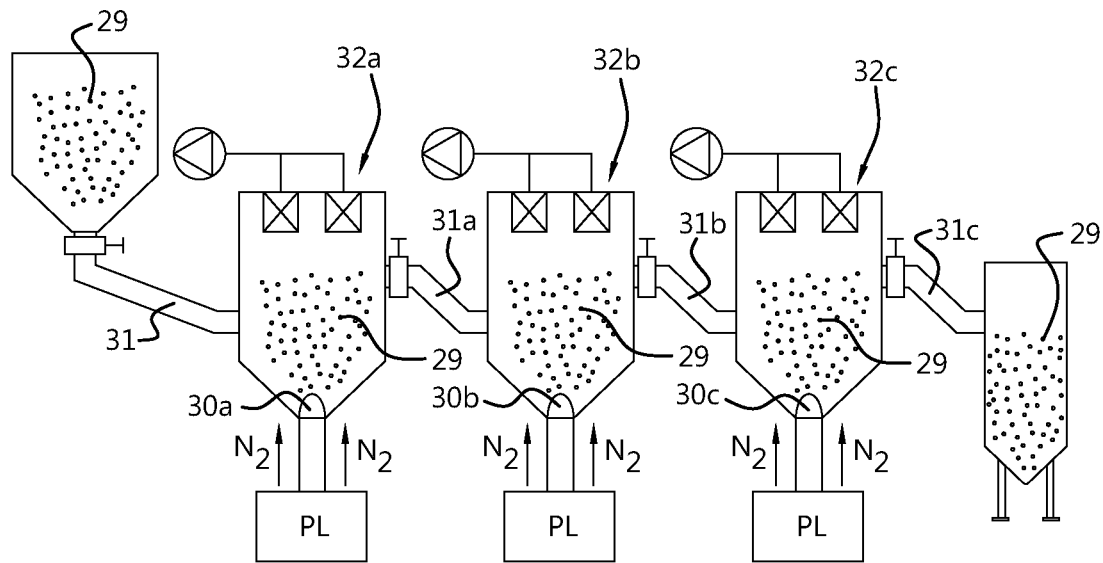
FIG. 3 illustrates a system and method according to the present invention.
Figure 4:
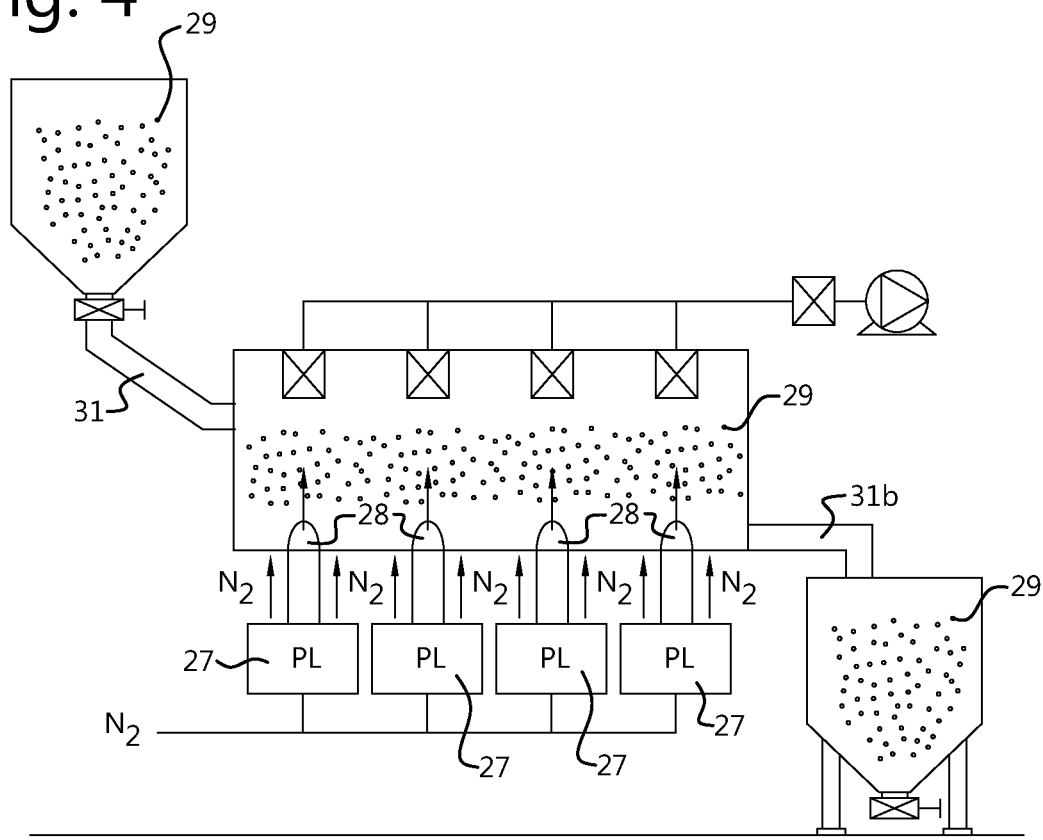
FIG. 4 illustrates an alternative apparatus and method according to the present invention.

Two types of processes are illustrated in FIGS. 3 and 4. FIG. 3 shows a series process using multiple coating reactor apparatuses. Herein, the particulate matter (29) can be fed (31) to a first coating reactor apparatus (32a) where it can be coated a first time, after which the at least partially coated particulate matter can be extracted and fed into (31a) a second coating reactor apparatus (32b), in which it is coated further, after which the coated particulate matter can again be extracted and fed into (31b) a third coating reactor apparatus (32c). The final product, i.e. the particulate matter comprising a coating layer, can be extracted (31c) from the reactor chamber of the third coating reactor apparatus for storage, transport or for any further use. The process in FIG. 3 can be operated continuously, i.e. with a continuous feeding and extraction of particulate matter, or it can be operated in batch processes, wherein the particulate matter is fed into a coating reactor apparatus, then treated in said apparatus for a treatment period, and then extracted and fed into the next coating reactor apparatus, from which a previous batch of particulate matter was first extracted.

FIG. 4 shows a series process using multiple plasma coating flows within the same reactor chamber. Here the process is preferably continuous, and the particulate matter is fed (31) into the reactor chamber at an insertion rate, and extracted (31d) at an extraction rate which can be typically of the same size as the insertion rate. By regulating insertion and extraction rate, the average exposure time of the particulate matter to the plasma coating flows can be controlled.

A "low temperature", or "cold", plasma is defined herein as a plasma of which the temperature is sufficiently low to not melt or otherwise damage the precursor and/or substrate that are exposed to said cold plasma. The temperature of the plasma may preferably be 150° C. or lower, more preferably 130° C. or lower, still more preferably 100° C. or lower, yet more preferably 70° C. or lower, even more preferably 60° C. or lower, yet more preferably 55° C. or lower, still even more preferably 50° C. or lower, even yet more preferably 45° C. or lower. The temperature of the plasma may preferably be as low as room temperature, i.e., the temperature surrounding the plasma. Depending on the location where the coating process is carried out, room temperature may be in the range of 10 to 40° C., preferably 15-30° C., such as 20-25° C. The temperature of the plasma will generally not be lower than room temperature.

When depositing temperature sensitive coatings it may be important to keep the temperature of the plasma steady at the optimal value. Depending on the type of precursor or precursor mixture and/or the pressure, the optimal temperature may be selected. Hence, in an embodiment the temperature of the plasma is selected taking into account the type of precursor, the precursor mixture and/or the plasma pressure.

The plasma of the present invention is an atmospheric plasma which has a pressure around ambient pressure. Such plasma is created and discharged at a pressure of between 400 and 1600 hPa, preferably at a pressure between 450 and 1400, even more preferably at a pressure between 500 and 1300 hPa, yet more preferably between 600 and 1250 hPa, even more preferably between 700 hPa and 1200 hPa, still more preferably between 800 hPa and 1150 hPa, yet more preferably between 900 hPa and 1100 hPa, most preferably about ambient pressure, which can typically be about 1013 hPa. Pressure of the plasma can play an important role in the quality of the deposited layer. Some plasma precursors are sensitive to too low and/or too high plasma pressures compared to the atmospheric pressure, while other precursors provide a better coating at lower or higher plasma pressures. However, note that low-energy, cold plasma can typically be applied under reduced pressure of lower than 400 hPa down to vacuum, or increased pressure of more than 1600 hPa, both types requiring a pressure vessel to maintain such low or high pressures. The use of a plasma with pressures in the currently preferred ranges around the ambient pressure reduces any costs and difficulties relating to maintaining pressure differences and pressure gradients.

In a preferred embodiment, the plasma is a dielectric barrier discharge plasma under atmospheric pressure.

The functionality of the layer may depend on the plasma conditions, e.g. temperature and pressure, in which the layer is deposited. The temperature and/or atmospheric conditions may therefore be selected taking into account the desired functionality of the coating layer.

In a preferred embodiment, the plasma gas (22) is ionized by means of electrodes (21a, 21b), whereby more preferably said plasma gas is ionized by said electrodes with a power of at most 10 Watt per $cm^2$ of the electrode surface, more preferably at most 9 $W/cm^2$, still more preferably at most 8 $W/cm^2$, even more preferably at most 7.5 $W/cm^2$. In many embodiments of the present invention, the power applied by the electrodes is minimally 1 $W/cm^2$, preferably minimally 2 $W/cm^2$, still more preferably minimally 2.5 $W/cm^2$. The power is most preferably between 2.5 and 7.5 $W/cm^2$.

In a preferred embodiment, the plasma gas (22) comprises inert gas for at least 99% by volume. The use of an inert gas as plasma gas essentially ensures that no reactions take place with the plasma gas and the equipment, between molecules of the plasma gas themselves, even not if temperature is increased. In fact, the lack of reactions also seems to allow to keep the plasma temperature low, e.g. less than 50° C. and preferably around room temperature. The low temperature of the plasma allows treatment of substrates made from a wide range of materials. Furthermore, this allows a better control over the formed coating and the adhesion properties thereof. Without wishing to be bound by theory, the inventors believe that the lack of reactive gas in the plasma gas ensures that none to very few chemical reactions with the plasma gas take place at the surface of the substrate, hence the better control over the adhesion properties. Also, if the plasma gas is nitrogen ($N_2$) or is mainly comprised of $N_2$, the low power applied to the plasma in embodiments of the present invention, are seen to result in very little to none nitrogen incorporated in the resulting coating. This is in stark contrast with the use of e.g. $O_2$, $NH_3$ or $CH_4$ as a plasma gas, all of which are deemed reactive gasses, and all of which seem to leave more traces within the coating of the plasma gas, thereby leading to loss of control over the adhesion properties.

In a preferred embodiment, the precursor is added in a plasma gas afterglow. Hereby plasma gas flows over and between a plasma-inducing system, e.g. a set of electrodes. Downstream of the plasma-inducing system, a plasma gas afterglow is present, which comprises a large number of ionized plasma gas molecules which did not have the time to de-ionize. The precursor is preferably introduced in said plasma gas afterglow. As a result, the precursor does not need to be introduced in between e.g. electrodes which are used to ionize the plasma gas, and thus the electrodes may be kept clean for a long duration as the precursor cannot form a layer onto the electrodes.

In a preferred embodiment, said plasma gas comprises inert gas for at least 99% by volume, i.e. 1% by volume (vol. %) or less of the plasma gas is a reactive gas. More preferably at least 99.5 vol %, still more preferably at least 99.8 vol %, still more preferably at least 99.9 vol %, even more preferably at least 99.95 vol %, yet more preferably at least 99.99 vol % of the plasma gas is an inert gas. This means that the plasma gas preferably comprises 1 vol. % or less $O_2$, more preferably at most 0.5 vol %, still more preferably at most 0.2 vol %, yet more preferably at most 0.1 vol %, still more preferably at most 0.05 vol %, even more preferably at most 0.01 vol % of 02. In the atmospheric plasma process of the present invention, this can for instance be achieved by using an overpressure with respect to ambient pressure, e.g. the plasma gas is delivered at a pressure of at least 1013 mbar, preferably at least 1020 mbar, more preferably at least 1030 mbar, even more preferably at least 1040 mbar, still more preferably at least 1050 mbar. Such slight overpressures allow to create an oxygen-poor and even oxygen-free zone in the plasma afterglow.

In an embodiment, the plasma gas comprises $N_2$, preferably the plasma gas being comprised of $N_2$ for at least 99 vol %. Alternatively, or additionally, the plasma gas comprises a noble gas, preferably He, Ne and/or Ar.

In a preferred embodiment, the particulate matter is subjected to the plasma in an oxygen-poor region, whereby preferably the oxygen-poor region comprises at most 1 vol % of $O_2$.

In an embodiment of the invention, the plasma gas flow is between 1 and 1500 standard liter per minute ("slpm" or "slm"), more preferably between 50 and 1500 slpm. 1 "slpm", or 1 "slm", is a liter of the gas at atmospheric pressure and at room temperature. More preferably the plasma gas flow is between 80 slpm and 1000 slpm.

In embodiments of the invention, the plasma coating has a thickness between 5 and 600 nm, preferably between 5 and 500 nm, more preferably between 10 and 500 nm, even more preferably between 10 and 300 nm, yet more preferably between 10 and 200 nm, still more preferably between 10 and 80 nm, such as 10 nm, 20 nm, 30 nm, 40 nm, 50 nm, 60 nm, 70 nm, 80 nm or any value therebetween, most preferably about 20 nm. The plasma coating thickness can be well-controlled by controlling the exposure time of the particulate to the plasma coating flow (5).

The method of the present invention is particularly useful to treat particulate matter which can be difficult to treat, due to e.g. the inert nature or extreme fragility (such as natural materials, or biodegradable/water soluble materials). Preferably, the particulate material comprise any or any combination of the following materials:

Polymers:
Commodities, such as PE, PP, PVC, PS, EPDM, polyolefins,
Engineering thermoplastics such as PET, PBT, PMMA, PC, PES, polyamides, aramides, Acrylonitrile styrene acrylate (ASA), acrylonitrile butadiene styrene (ABS),
Fluorinated polymers such as PTFE, PVDF, Fluorinated ethylene propylene (FEP),
Biodegradable polymers such as PLA, PCL,
Cross-linked polymers such as epoxy-amines, polyurethanes, silicones,
Carbon fibres
Water soluble polymers such as PEG, polyvinyl pyrrolidone (PVP), polyvinyl alcohol (PVA), polyacrylic acid (PAA), polyacrylamides, divinyl ether-maleic anhydride (DIVEMA), polyoxazoline, polyphosphates, polyphosphazenes,
Natural materials such as rayon or viscose, polysaccharides, chitosan, collagen, proteins, xanthan gum, pectins, dextran, carrageenan, guar gum, hyaluronic acid (HA), leather, cellulosic materials (paper),
Metals such as gold, silver, copper, iron, brass, lead, iron, tin, stainless steel, aluminium, zinc, titanium, including all possible alloys and oxides,
Inorganic materials such as glass, silicon wafers, metal oxides (e.g. Al2O3, ZnO), carbides (e.g. SiC, titanium carbide), nitrides (e.g. Si3N4)

In a preferred embodiment, the particulate matter comprises, and preferably essentially consists of, fibers. Said fibers preferably comprise a length between 1 mm and 100 mm, more preferably between 5 mm and 90 mm, yet more preferably between 20 mm and 70 mm, most preferably around 50 mm. Also, preferably said fibers comprise a maximum diameter of at most 2000 μm, preferably at most 1500 μm, yet more preferably at most 1000 μm, still more preferably at most 800 μm, such as 700, 600, 500, 400, 300, 200, 100 μm or any value there between or lower. Preferably, said fibers comprise plastic fibers, polymer fibers, glass fibers, carbon fibers or any combination thereof. Preferably, if polymer fibers are used in the present invention as particulate matter, these polymer fibers comprise polyethylene, polyethylene terephthalate or a combination thereof. Preferably, said fibers comprise a density between 1 and 100 grams per liter (g/l), preferably between 2 and 80 g/l, more preferably between 3 and 60 g/l, yet more preferably between 4 and 40 g/l, most preferably around 10 g/l.

In a preferred embodiment, the particulate matter may comprise any suitable material, for example metals, metal oxides, silica and silicates, e.g. rice hull ash, carbon, organic powdered substrates, including polymeric, dyestuffs, fragrances, flavourings, pharmaceutical powdered substrates such as penicillins and antibiotics as well as biologically active compounds for example proteins, including enzymes and other protein based materials. The powdered substrate may also comprise biochemical compounds such as amino acids and/or their derivatives, grafted or covalently bonded biochemical compounds such as proteins, enzymes and DNA, silicone resins, mineral fillers such as for example carbon black, clays, CaCO3, talc, silica, mica conductive fillers, TiO2 nanoparticles, metal oxides such as TiO2, ZrO2, Fe2O3 Al2O3SiO2, B2O3, Li2O, Na2O, PbO, ZnO, or, CaO, Pb3O4 and CuO and mixed oxides, graphite, phosphorus particles, pigments and the like; metalloid oxides, mixed oxide, organometallic oxides, organometalloid oxides, organomixed oxide resins and/or an organic resin, sodium carbonate potassium nitrate, silicon metal particles, silicone rubber crumb, organic rubber crumb such as EPDM and Polypropylene. Rice hull ash is a biogenic amorphous silica, comprising 93 to 97% crystalline silica, which generally contains less than 5% by weight of amorphous carbon and less than 1% by weight of other various silicas.

In an embodiment, the precursor is a polymerizable compound. This allows the coating to be a polymer coating. In case the desired coating is a polymer coating, such coating may be obtained by the present method wherein the precursor is the polymerizable compound, whereby the compound can polymerize on the substrate, i.c. the particles, directly. In an embodiment, the coating is a polymer coating.

In an embodiment, the coating is a graft coating.

The precursor may preferably comprise organic materials, including carboxylates, methacrylates, acrylates, styrenes, methacrylonitriles, alkenes and dienes, for example methyl methacrylate, ethyl methacrylate, propyl methacrylate, butyl methacrylate, and other alkyl methacrylates, and the corresponding acrylates, including organofunctional methacrylates and acrylates, including glycidyl methacrylate, trimethoxysilyl propyl methacrylate, allyl methacrylate, hydroxyethyl methacrylate, hydroxypropyl methacrylate, dialkylaminoalkyl methacrylates, and fluoroalkyl (meth)acrylates, methacrylic acid, acrylic acid, fumaric acid and esters, itaconic acid (and esters), maleic anhydride, styrene, α-methylstyrene, halogenated alkenes, for example, vinyl halides, such as vinyl chlorides and vinyl fluorides, and fluorinated alkenes, for example perfluoroalkenes, acrylonitrile, methacrylonitrile, ethylene, propylene, allyl amine, vinylidene halides, butadienes, acrylamide, such as N-isopropylacrylamide, methacrylamide, epoxy compounds, for example glycidoxypropyltrimethoxysilane, glycidol, styrene oxide, butadiene monoxide, ethyleneglycol diglycidylether, glycidyl methacrylate, bisphenol A diglycidylether (and its oligomers), vinylcyclohexene oxide, conducting polymers such as pyrrole and thiophene and their derivatives, and phosphorus-containing compounds, for example dimethylallylphosphonate. Organic precursors may also include an organic compound comprising any one of the following groups alkenyl, aryl, H, —OH, amino groups, aldehyde groups alkyl halide groups, alkyne groups amido groups, carbamate groups, urethane groups, organic salts, carboxylic acid groups and their derivatives such as acid anhydride groups, organic groups containing boron atoms, phosphorus and sulphur containing groups such as mercapto and sulphido groups and grafted or covalently bonded biochemical groups such as amino acids and/or their derivatives, grafted or covalently bonded biochemical species such as proteins, enzymes and DNA.

In a preferred embodiment, the excited precursor is ionized.

In an embodiment of the above methods, the precursor is injected in the plasma jet as a gas, as a liquid or as a solid, preferably as a gas or as a liquid in the form of an aerosol, most preferably as a liquid in the form of an aerosol. Preferably, an aerosol is used and the temperature of the plasma is 150° C. or lower, more preferably 130° C. or lower, still more preferably 100° C. or lower, yet more preferably 70° C. or lower, even more preferably 60° C. or lower, yet more preferably 55° C. or lower, still even more preferably 50° C. or lower, even yet more preferably 45° C. or lower. The temperature of the plasma may preferably be as low as room temperature, i.e., the temperature surrounding the plasma.

In an embodiment, the particulate is in a fluidized state by a fluidizing flow. Hereby, the particulate itself flows with a particulate flow. Such fluidization is preferably obtained using a fluidized bed reactor. In a preferred embodiment, the plasma coating flow is directed essentially along the particulate flow when subjecting the particulate to the plasma coating flow. In an alternative embodiment, the plasma coating flow is directed essentially opposite to the particulate flow when subjecting the particulate to the plasma coating flow. In yet another embodiment, the plasma coating flow is directed essentially perpendicular to the particulate flow when subjecting the particulate to the plasma coating flow. In an embodiment, the plasma coating flow is directed in a direction between the direction of the particulate flow and a direction perpendicular to the particulate flow or in a direction between the direction counter to the particulate flow and a direction perpendicular to the particulate flow. Basically, the direction in which the plasma coating flow is directed with respect to the particulate flow is preferably selected in order to optimize the process of coating the particles of the particulate.

In an embodiment, the particulate is rotated during the step of subjecting the particulate matter to said plasma coating flow. This is particularly preferred in case the particulate matter is subjected to the plasma coating flow is a non-central location. By rotating the particulate during the subjection step, the particles in the particulate can be coated more homogeneously. Rotation of the particulate can be obtained by e.g. rotating the bottom of a reaction chamber and/or by another rotating component in the reaction chamber. Furthermore, rotation of the particulate also allows changing the shape and/or size of the particles in the particulate, e.g. by grinding, agglomeration, spheronisation, etc.

Rotating the particulate can be performed without bringing the particulate in a fluidized state. In this case, rotation can be achieved by rotating the bottom or any other recipient onto which the particulate matter is placed. However, in another embodiment which may be more preferred, the particulate is rotated while being in a fluidized state for obtaining a coating which is uniform over the full particulate. Rotation of the particulate in a fluidized state can be achieved by inducing swirls, which can be achieved by e.g. a rotating bottom in the reaction chamber.

The present invention also relates to a coating reactor apparatus as described above and in the claims, and as further described below.

The coating reactor apparatus (1) for coating particulate matter (3) comprises a plasma jet apparatus (7), which comprises a plasma jet outlet (11) for producing a plasma jet and a nozzle (12). The coating reactor apparatus also comprises a precursor supply (13) and a reactor chamber (2). Hereby, the nozzle (12) comprises a set of nozzle inlets (14) for injection of a plasma (15) and/or a precursor (16), i.e. the plasma (15) and/or precursor (16) is injected into the nozzle (12) via this set of nozzle inlets. Hereto, at least one nozzle inlet (14) is in fluid connection with the plasma jet outlet (11). The nozzle also comprises at least one nozzle outlet (17) for ejection of a precursor-comprising plasma (5). The nozzle outlet (17) is located within the reactor chamber (2) such that the precursor-comprising plasma, which is a plasma coating flow, is ejected from the nozzle into the reactor chamber. The nozzle comprises a nozzle body (18) extending from the nozzle inlets (14) to the nozzle outlet

(17) for guiding a precursor-comprising plasma coating flow (5) to within the reaction chamber. Preferably the nozzle body comprises a cylindrical shape. Preferably the nozzle comprises one nozzle inlet (14) which is in fluid connection with both the plasma jet outlet (11) and the precursor supply (13).

Note that the nozzle inlet (14) is located outside of the reaction chamber (2), whereas the nozzle outlet (17) is located within the reaction chamber (2). Furthermore, the reaction chamber (2) confines the particulate matter to an essentially closed off volume during the coating.

The precursor supply (13) is in fluid connection with at least one nozzle inlet (14) in order to allow insertion of the precursor (16) into the nozzle body (18). The reactor chamber is used for subjecting particulate matter in the reaction chamber to a plasma coating flow in a controlled environment.

Preferably the reactor chamber (2) of the coating reactor apparatus is the reactor chamber (2) of a fluidized bed reactor (8), i.e. preferably the coating reactor apparatus comprises a fluidized bed reactor (8), the reactor chamber of which is used as the reactor chamber for the apparatus of the present invention.

A fluidized bed reactor (FBR) (8) is a type of reactor device that can be used to carry out a variety of multiphase chemical reactions. In this type of reactor, a fluid (gas or liquid) is passed through a solid particulate material at high enough speeds to suspend the solid and cause it to behave as though it were a fluid. A FBR comprises a reactor chamber (2), and preferably comprises a porous plate (9), typically located at the bottom of the reactor chamber. This porous plate is usually termed a 'distributor'. The distributor (9) prevents the particles of the particulate to leave the chamber, but allows a fluid flow (10) to pass through to bring the particulate in a fluidized state.

In a preferred embodiment, the distributor comprises a hole, preferably a central hole, and the nozzle body (18) passes through the hole such that the nozzle outlet is in the reactor chamber and the set of nozzle inlets are located outside of the reactor chamber.

We have already discussed a method wherein the particulate is in a fluidized state by a fluidizing flow. Such fluidization is preferably obtained using a fluidized bed reactor. In some cases the plasma coating flow is preferably directed along the particulate flow. In the embodiment of FIGS. 1A and 2, the nozzle body (18) passes through a hole in the bottom of the reaction chamber. This allows the plasma coating flow (5) to be directed essentially along the particulate flow when subjecting the particulate to the plasma coating flow. In an alternative embodiment, as illustrated in FIG. 1B, the nozzle body passes through a side wall or a top wall of the reaction chamber. Preferably hereby, the nozzle outlet is located such that the plasma coating flow (5) is directed essentially opposite to the particulate flow when subjecting the particulate to the plasma coating flow. In yet another embodiment, as illustrated in FIG. 1C, the nozzle body passes through a side wall of the reaction chamber, whereby preferably the nozzle outlet is located such that the plasma coating flow (5) is directed essentially perpendicular to the particulate flow when subjecting the particulate to the plasma coating flow. This can be achieved, as illustrated in FIG. 1C, by arranging the nozzle body through a sidewall of a FBR and arranging the nozzle outlet such that the plasma coating flow is directed horizontally and tangentially to the sidewall and/or the particulate flow. In an embodiment, the location of the nozzle outlet and/or the nozzle body is selected in order to optimize the process of coating the particles of the particulate. Additionally or alternatively, the orientation of the nozzle outlet and/or the nozzle body is selected in order to optimize the process of coating the particles of the particulate.

In a preferred embodiment, the nozzle is positioned such that the plasma coating flow is directed tangentially to the sidewall, as illustrated in FIG. 1C. Such arrangement allows to significantly increase the processing capacity, speed, etc. compared to vertical positioning, i.e. where the nozzle is positioned at the top or bottom of the reaction chamber, because one can position more nozzles in tangential position compared to vertical positioning. Hereby, a uniform treatment of the particles in the particulate can be ensured by positioning the nozzles at regular intervals around the sidewall.

The embodiments wherein the nozzle and/or nozzle body is arranged such that the plasma coating flow is directed along or counter to the particulate flow may be preferred in cases where the plasma coating flow could seriously interfere with and/or alter the particulate flow, e.g. an interference which could hinder the fluidization of the particulate or the normal operation of the FBR.

In a preferred embodiment, the reaction chamber comprises a rotating bottom, e.g. to make spherical particles to be coated. This embodiment is preferably combined with a nozzle and/or a nozzle body which is oriented such that the plasma coating flow (5) is directed essentially perpendicular to the particulate flow when subjecting the particulate to the plasma coating flow, preferably oriented horizontally tangentially to the sidewall of the reaction chamber and/or to the particulate flow.

In an embodiment, the nozzle body or each of a set of nozzle bodies passes through the bottom of the reactor chamber and is arranged such that the plasma coating flow is directed tangentially to the bottom of the reactor.

In a preferred embodiment, the nozzle is 3D printed. Hereby, the use of a low-temperature plasma allows use of printable nozzles. Preferably the set of nozzle inlets, the at least one nozzle outlet and the nozzle body are configured to optimize the plasma coating flow. 3D printing of the nozzle allows to make easy alterations to the nozzle to test other configurations, but also allows easy replacement of a nozzle in case of maintenance or reparation.

In an embodiment, the reactor chamber comprises a flow guiding device (23) comprising a hollow body, a flow inlet (24) and a flow outlet (25), whereby the nozzle outlet (17) is preferably located within the hollow body. The flow guiding device (23) helps to guide fluidized particulate matter into the plasma coating flow. The inventors have noticed that if the reactor chamber is relatively small, the particles of the fluidized particulate matter will come into contact with the plasma coating flow. However, the inventors have also noticed that if the reactor chamber becomes larger, e.g. in order to scale up the process, then it can help to guide the flow of the fluidized particulate matter, in particular to guide the flow of the fluidized particulate matter such that it comes into contact with the plasma coating flow. Preferably, the flow guiding device is a hollow tube which is open at its longitudinal ends and which can be placed around the nozzle outlet and partially around the nozzle body.

In an embodiment, the coating reactor apparatus comprises multiple plasma jet apparatuses (27), each comprising a plasma jet outlet and a nozzle comprising nozzle inlets and at least one nozzle outlet (28), each nozzle outlet (28) of the multiple plasma jet apparatuses being located within the reaction chamber. Such setup allows to create multiple separate plasma coating flows in a reactor chamber, which in turn allows better coating. The use of different plasma coating flows in the same reactor chamber allows one to subject the particulate matter subsequently to multiple plasma coating flows and thus allows performing steps a to c of the method of the present invention in series. This type of apparatus also is preferred if the particulate matter is coated in a continuous process.

The present invention also relates to systems comprising multiple coating reactor apparatuses. Such systems are described above and in the claims, and are further described below.

In an embodiment, the system comprises multiple coating reactor apparatuses, whereby the reactor chambers of the multiple reactor apparatuses are connected in series such that particulate matter can be coated subsequently in each of said multiple reactor apparatuses. Hereto, the reactor chambers each have one or more chamber inlets and one or more chamber outlets, whereby a chamber outlet of a first reactor chamber is or can be brought in fluid connection with the chamber inlet of a second reactor chamber. The use of different plasma coating flows in the multiple reactor chamber allows one to subject the particulate matter subsequently to multiple plasma coating flows and thus allows performing steps a to c of the method of the present invention in series. This type of system also is preferred if the particulate matter is coated in a continuous process, whereby the extracted coated particulate matter from the outlet of a first reactor chamber is fed to a second reactor chamber via an inlet thereof.

In an embodiment, the system comprises multiple coating reactor apparatuses which are organized in parallel, whereby the reactor apparatuses are configured to simultaneously coat particulate matter. As such, this system allows performing steps a to c of the method of the present invention in parallel. This type of system also is preferred if the particulate matter is coated in a batch process, whereby at least one of the coating reactor apparatuses can be unloaded from coated particulate matter and/or loaded with uncoated or partially coated particulate matter while other coating reactor apparatuses are performing the steps a to c of the method of the present invention.

EXAMPLES

Test beads were used in a method according to the present invention, using an apparatus according to the present invention.

In the first two experiments, the test beads were sugar beads having an average diameter of about 1 mm. The amount of beads was selected to have optimal fluidization, and was ca. 400 to 600 g. The plasma jet apparatus was a PlasmaSpot® device from Molecular Plasma Group. The particles were treated using a fluidized bed reactor.

In a first experiment, the sugar beads were treated using 2-Hydroxyethyl methacrylate (HEMA, CAS 868-77-9) with 1 wt. % Rhodamine 6 g as a precursor. The plasma jet apparatus was operated with a plasma generating power of 450 W, using nitrogen gas as plasma gas in flow of 122 standard liter per minute (slm) at around atmospheric pressure of 1 atm. The precursor flow was 1.6 slm and the dilution flow was 10.0 slm. 600 grams of sugar beads with average diameter of about 1 mm were treated subsequently twice for 600 seconds (in total 1200 seconds). The effect of the treatment could be clearly seen under an UV lamp. Treatment for another 600 seconds improved visual inspection of the coating even without UV lamp. The treatment was very homogenous: all treated beads were equally covered as could be visually inspected by the homogeneous colour, i.c. slightly pink due to the grafted Rhodamine 6G.

In a second experiment, the sugar beads were treated using 1H,1H,2H,2H-perfluorodecyl acrylate (PFDA, CAS 27905-45-9) as a precursor. The plasma jet apparatus was operated with a plasma generating power of 450 W, using nitrogen gas as plasma gas in flow of 120 standard liter per minute (slm) at around atmospheric pressure of 1 atm. The precursor flow was 1.6 slm and the dilution flow was 10.0 slm. 460 grams of sugar beads with average diameter of about 1 mm were treated for 600 seconds. The treated beads show electrostatic effects and testing revealed that while untreated beads were very wettable, treated beads would literally float at the surface of a water film. The treated beads were analyzed using X-ray photoelectron spectroscopy (XPS), which enabled us to quantitatively confirm grafting of fluorinated moieties.

In a third experiment, polyethylene powder of average size of about 150 µm was treated using N-(3-Trimethoxysilylpropyl)diethylenetriamine (TRIAP, CAS 35141-30-1) as an amine-functional precursor. The plasma jet apparatus was operated with a plasma generating power of 450 W, using nitrogen gas as plasma gas in flow of 80 standard liter per minute (slm) at around atmospheric pressure of 1 atm. The precursor flow was 1.2 slm and the dilution flow was 20 slm. The fluidized bed was operated with a nitrogen flow of 0.38 $m^3$/min and with a distributor plate having a filter of 50 µm. The plasma coated powder using the method according to the present invention shows grafting of the triap on the powder which remains stable for at least 5 days. This was shown using a staining test, which allows quantification of amino groups, as described in:

C Geismann, M Ulbricht, Macromol Chem and Phys 2005, 206, 268; and

A Papra, H G Hicke, D Paul, J Appl Polym Sci 1999, 74, 1669.

The procedure of the staining test is summarized as follows:

1. Bonding: Samples to be shaken overnight in a solution of 500 µmon Acid Orange II
   (CAS 633-96-5) in water (pH 3, HCl) at room temperature.
2. Wash: Samples to be washed/rinsed with water (pH 3). Repeat three times.
3. Elute: Immerse samples in 10 mL of water (pH 12, NaOH). Shake for 15 min.
4. The UV/Vis absorption of the solution is recorded at 479 nm.
5. Establish a calibration curve of respective dyes in the solvent used for elution.

Three sample were tested using the staining test:

A first untreated sample

A second sample which was treated by plasma without precursor

A third sample treated in accordance with the method of the present invention, using TRIAP as precursor The results of the staining show that:

1: the untreated PE powder does not contain any primary amines, and therefore does not bond the acid orange to the particles. The solution stays coloured (i.e. due to the presence of acid orange in the solution), and the powder is seen floating on top of the solution.

2: the plasma treated powder does not contain any primary amines, and therefore does not bond the acid orange to the particles. The solution stays coloured (i.e. due to the presence of acid orange in the solution).

However, the particles behave more hydrophilic (they stay longer dispersed into the aqueous solution) due to the surface energy increase of the $N_2$ plasma treatment.

3: the plasma coated powder (with TRIAP precursor) contains a lot of primary amines on the surface, and bonds ALL(!) acid orange that was initially present in the solution. The particles are visually orange, while the acidic solution was rendered completely transparent.

The invention claimed is:

1. A plasma coating method for coating particulate matter in a reaction chamber, comprising the steps of:
    a) providing a low-temperature atmospheric plasma jet from a plasma gas outside of the reaction chamber;
    b) inserting a precursor into the plasma jet, thereby obtaining a plasma coating flow comprising an excited precursor, followed by injecting the plasma coating flow comprising the excited precursor into the reaction chamber; and
    c) subjecting particulate matter in the reaction chamber to said plasma coating flow comprising said excited precursor,
    thereby obtaining particulate matter comprising an at least partial coating, the low-temperature of the plasma being at a temperature that is sufficiently low that the precursor and/or the substrate that are exposed to the plasma are not melted or damaged,
    wherein the particulate matter is subjected to the plasma in a fluidized state,
    wherein the method is executed using a fluidized bed reactor within the reaction chamber.

2. The plasma coating method according to claim 1, wherein the particulate matter is subjected indirectly to the plasma.

3. The plasma coating method according to claim 1, wherein the at least partial coating is a complete coating.

4. The plasma coating method according to claim 1, wherein the plasma gas comprises an inert gas,
    wherein the plasma gas is comprised of an inert gas for at least 99 vol %,
    wherein the plasma gas comprises N2,
    wherein the plasma gas is comprised of N2 for at least 99 vol %, and/or the plasma gas comprises a noble gas, and/or
    wherein the plasma gas comprises He, Ne and/or Ar.

5. The plasma coating method according to claim 1, wherein the particulate matter is rotated during step c.

6. The plasma coating method according to claim 1, wherein the particulate matter is subjected to the plasma in an oxygen-poor region,
    wherein the oxygen-poor region comprises at most 1 vol % of O2.

7. The plasma coating method according to claim 1, wherein the precursor is a polymerizable compound.

8. The plasma coating method according to claim 1, wherein the particulate matter is coated by performing steps a to c in series,
    wherein particulate matter is subjected multiple times to plasma coating flow comprising the excited precursor.

9. The plasma coating method according to claim 1, wherein the particulate matter is coated by performing steps a to c in parallel,
    wherein the particulate matter is distributed in portions which are subjected to separate plasma coating flows.

10. The plasma coating method according to claim 1, wherein the precursor is inserted as an aerosol into the plasma jet.

11. The plasma coating method according to claim 1, wherein the particulate matter consists of fibers.

12. The plasma coating method according to claim 1, wherein the plasma of the plasma jet is 150° C. or lower.

13. The plasma coating method according to claim 1, wherein the plasma of the plasma jet is 100° C. or lower.

14. The plasma coating method according to claim 1, wherein the plasma of the plasma jet is 50° C. or lower.

15. The plasma coating method according to claim 1, wherein the plasma of the plasma jet is room temperature or the temperature surrounding the plasma.

* * * * *